United States Patent [19]
Yu

[11] Patent Number: 5,856,214
[45] Date of Patent: Jan. 5, 1999

[54] METHOD OF FABRICATING A LOW VOLTAGE ZENER-TRIGGERED SCR FOR ESD PROTECTION IN INTEGRATED CIRCUITS

[75] Inventor: Ta-Lee Yu, Hsinchu Hsien, Taiwan

[73] Assignee: Winbond Electronics Corp., Hsinchu, Taiwan

[21] Appl. No.: 610,475

[22] Filed: Mar. 4, 1996

[51] Int. Cl.[6] .......................... H01L 21/38; H01L 21/385; H01L 23/60
[52] U.S. Cl. .......................... 438/133; 438/237; 438/564; 438/983; 148/DIG. 174; 257/112; 257/356; 257/357
[58] Field of Search ..................... 438/564, 328, 438/133, 140, 983, 237; 257/358, 359, 112, 121, 356; 148/DIG. 174

[56] References Cited

U.S. PATENT DOCUMENTS

| | | | |
|---|---|---|---|
| 4,835,111 | 5/1989 | Wright et al. | 438/564 |
| 5,166,089 | 11/1992 | Chen et al. | 438/328 |
| 5,602,404 | 2/1997 | Chen et al. | 257/112 |

*Primary Examiner*—Mary Wilczewski
*Attorney, Agent, or Firm*—Fish & Richardson P.C.

[57] ABSTRACT

The method in accordance with the present invention is compatible with conventional CMOS fabrication processes to form a zener diode and a lateral silicon controlled rectifier constituting an on-chip ESD protection circuit in a semiconductor substrate. The zener diode is composed of a p-type doped region and an n-type doped region, wherein one of the doped regions, formed by deep diffusing impurities from a doped polysilicon layer, is arranged between two adjacent well regions. During an ESD event, the zener diode incurs breakdown to lower the trigger voltage of the lateral SCR device to within a range of about 5–7 Volts to thereby discharge the ESD current prior to damage of an internal circuit being protected.

9 Claims, 4 Drawing Sheets

METHOD OF FABRICATING A LOW VOLTAGE ZENER-TRIGGERED SCR FOR ESD PROTECTION IN INTEGRATED CIRCUITS

BACKGROUND OF THE INVENTION

1. Field of the Invention

The present invention generally relates to an electrostatic discharge (ESD) protecction circuit for integrated circuits. More particularly, the present invention relates to a method of fabricating a low-voltage zener-triggered silicon-controlled rectifier.

2. Description of the Related Art

Electrostatic discharge, ESD hereafter, is a common phenomenon that occurs during handling of semiconductor IC devices. An electrostatic charge may accumulate for various reasons and cause potentially destructive effects on an IC device. Damage typically can occur during a testing phase of its fabrication, during assembly of the IC onto a circuit board, as well as during use of equipment into which the IC has been installed. Damage to a single IC due to poor ESD protection in an electronic device can hamper some of its designed functions, or sometimes all of them. ESD protection for semiconductor ICs is, therefore, a reliability problem.

ESD stress models are based on the reproduction of typical discharge pulses to which the IC may be exposed during manufacturing or handling. Three standard models, known as the Human Body Model (HBM), Machine Model (MM), and Charged Device Model (CDM) have been developed. The human-body model is set forth in U. S. Military Standard MIL-STD-883, Method 3015.6. This Military Standard models the electrostatic stress produced on an IC device when a human carrying an electrostatic charge touches the lead pins of the IC device. The machine model is set forth in Industry Standard EIAJ-IC-121, which describes the electrostatic stress produced on an IC device when a machine carrying an electrostatic charge contacts the lead pins of the IC device. The charged device model describes the ESD current pulse generated when an IC device already carrying an electrostatic charge is grounded while being handled.

However, in light of the trend toward submicron scale IC fabrication, CMOS IC vulnerability to the ESD stress has been greatly reduced due to advanced processes, such as lightly-doped drains (LDD) structure and clad silicide diffusions. Lateral silicon controlled rectifiers (LSCR) have been utilized as the main components of ESD protection circuits for facilitating protection, while allowing the sub-micron semiconductor devices to function acceptably. An example, R. N. Rountree et al., "A PROCESS-TOLERANT INPUT PROTECTION CIRCUIT FOR ADVANCED CMOS PROCESSES," has been proposed in EOS/ESD *Symp. Proc.*, EOS-10, pp.201–205, 1988.

However, there is one inherent constraining design factor for the lateral SCR's used in ESD protection circuits for sub-micron semiconductor devices. The trigger voltage for lateral SCR's in sub-micron CMOS devices is in the range of 30 to 50 Volts. The typical thickness of gate oxide layers in CMOS fabrication processes employing a resolution of 0.6–0.8 microns is about 150–200 angstroms. Considering a dielectric breakdown strength of 10 MV/cm for typical $SiO_2$ material, the gate oxide layers in these sub-micron CMOS devices would be destroyed by a voltage of about 15–20 volts. Furthermore, as an example, for 0.5 m feature size CMOS technology with a gate oxide thickness of 105 angstroms, measurable Flower-Nordheim tunneling through the gate oxide starts at around 7 V and the breakdown occurs at 14.5 V. Therefore, lateral SCR's with a trigger voltage in the range of 30–50 volts must be fitted with other protection components so that they can provide protection for gate oxide layers in sub-micron CMOS IC devices.

Efforts have been made to lower the trigger voltage of lateral SCR's in the ESD protection circuits for the sub-micron CMOS device. The trigger voltage should be reduced to below the dielectric breakdown voltage of the gate oxide layers of the CMOS device, so that the ESD protection circuits can provide protection for the CMOS device before being damaged themselves. Several ways to lower the trigger voltage of lateral SCR have been proposed.

In one approach, A. Chatterjee and T. Polgreen proposed a low-voltage trigger SCR (LVTSCR) configuration in "A LOW-VOLTAGE TRIGGERING SCR FOR ON-CHIP ESD PROTECTION AT OUTPUT AND INPUT PADS, " *IEEE Electron Device Letters*, 12(1), 1991, pp.21–22. In their disclosure, Chatterjee and Polgreen employed a short-channel NMOS transistor coupled to an SCR to form the low-voltage trigger SCR having a trigger voltage that is about equal to the breakdown voltage ($BV_{dss}$) of the short-channel NMOS transistor.

Moreover, U. Sharma et al., "AN ESD PROTECTION SCHEME FOR DEEP SUB-MICRON VLSI CIRCUITS," 1995 *Symposium on VLSI Technology Digest of Technical Papers*, pp.85–86, present another low-voltage SCR configuration for an ESD protection circuit. Referring to FIG. 1, reference numerals 1 and 2 designate an Input/Output pad and an internal circuit to be protected. The internal circuit 2 is tied to the Input/Output pad 1 via a conducting line 3. An SCR device serves as the main component in a protection circuit. In the drawing, the SCR device consists essentially of a pnp bipolar junction transistor $T_1$ and an npn bipolar junction transistor $T_2$. The collector of the pnp transistor $T_1$ is connected together with the base of the npn transistor $T_2$, forming a cathode gate identified by the node 7. The cathode gate 7 is coupled to the emitter of the npn transistor $T_2$, via a spreading resistor $R_p$, constituting a cathode 5 which is connected to a $V_{SS}$ terminal of the CMOS IC device. The base of the pnp transistor $T_1$ is connected together with the collector of npn transistor $T_2$ to form an anode gate identified by the node 6. The anode gate 6 is coupled to the emitter of the pnp transistor $T_1$, via a spreading resistor $R_n$, constituting an anode 4 which is connected to the conducting line 3.

As shown in FIG. 1, a zener diode $Z_1$ is incorporated to lower the trigger voltage of the lateral SCR device constituted by the bipolar transistors, $T_1$ and $T_2$. The zener diode $Z_1$ is provided with a cathode terminal and an anode terminal connected to the anode gate 6 and the cathode gate 7 of the lateral SCR device, respectively. When an ESD event occurs, the zener diode $Z_1$ breaks down and triggers the lateral SCR device to latchup which starts in the high conduction state. Once the latchup happens, the ESD current is mainly discharged through the lateral SCR device. Accordingly, the ESD stress on the Input/Output pad 1 is clamped by the holding voltage of the turned-on lateral SCR device to about 1–2 Volts so as to protect the internal circuit 2 which is connected to the Pad 1. Usually, the zener-triggered SCR device has a trigger voltage that is about equal to the breakdown voltage of the zener diode $Z_1$, ranging from about 5 Volts to about 7 Volts.

SUMMARY OF THE INVENTION

Therefore, it is an object of the present invention to provide a method of fabricating a low voltage zener-triggered SCR compatible with CMOS fabrication for use as an on-chip ESD protection circuit.

The present invention achieves the above-identified object by providing a method of fabricating an ESD protection circuit, which is constituted by a silicon-controlled rectifier and a zener diode, comprising the following steps:

(a) providing a semiconductor substrate;

(b) forming a first well region of a first conductivity type in said substrate and a second well region of a second conductivity type in said substrate having a junction therebetween;

(c) forming a polysilicon layer doped with impurities of the first conductivity type having at least a portion overlying the well regions over the junction;

(d) forming a doped region striding between the well regions by deep diffusing the impurities from the polysilicon layer into the substrate;

(e) forming a doped region of the second conductivity type in the second well region in a vicinity of the doped region of the first conductivity to build up the zener diode; and (f) forming an anode of the silicon-controlled rectifier in one of the well regions as well as a cathode of the silicon-controlled rectifier in the other one of the well regions.

BRIEF DESCRIPTION OF THE DRAWINGS

Other objects, features and advantages of the present invention will became apparent by way of the following detailed description of the preferred but non-limiting embodiment. The description is made with reference to the accompanying drawings, wherein.

DETAILED DESCRIPTION OF THE PREFERRED EMBODIMENTS

Referring to FIGS. 2A–2E, the process flow in accordance with the present invention is depicted in crosssectional views. These drawings merely show several key steps in the sequential processes. The detailed description is as follows.

Figure 2A:
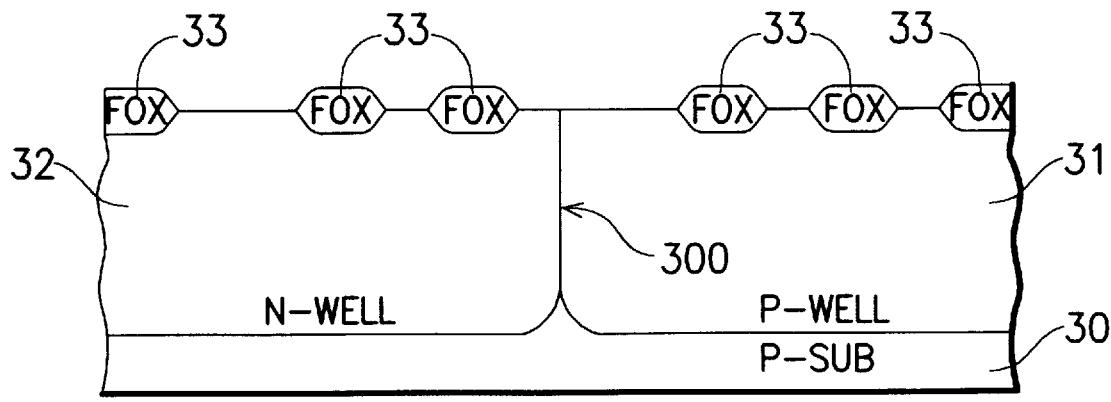
FIGS. 2A through 2E schematically show in cross section the processing flow of fabricating the low voltage zener-triggered SCR device in accordance with one preferred embodiment of the present invention.

First, as shown in FIG. 2A, a p-well region 31 and an n-well region 32 are formed in a p-type silicon substrate 30. As known in this art, those wells 31 and 32 may be formed by implanting ions of opposing conductivity types, p-type and n-type, respectively, having a junction 300 therebetween. By a local oxidation of silicon (LOCOS) procedure, spaced-apart field oxides 33 are formed on the well regions 31 and 32.

Figure 2B:
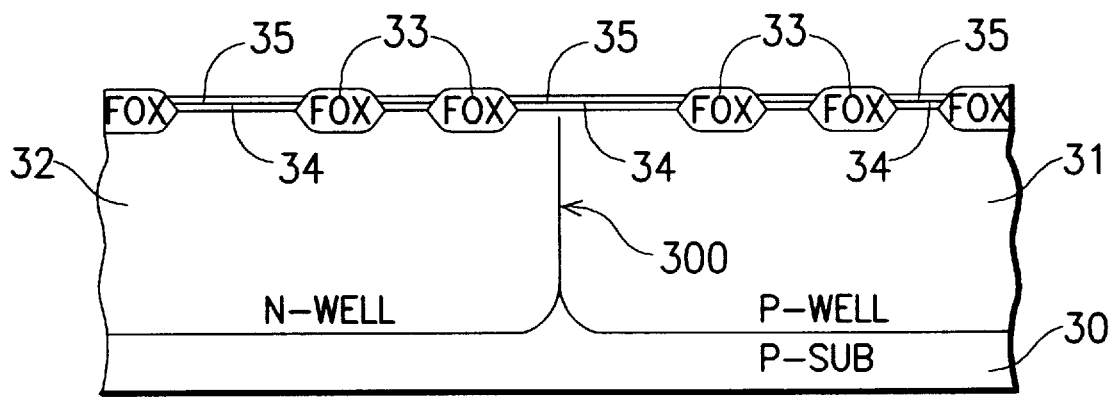
Figure 2C:
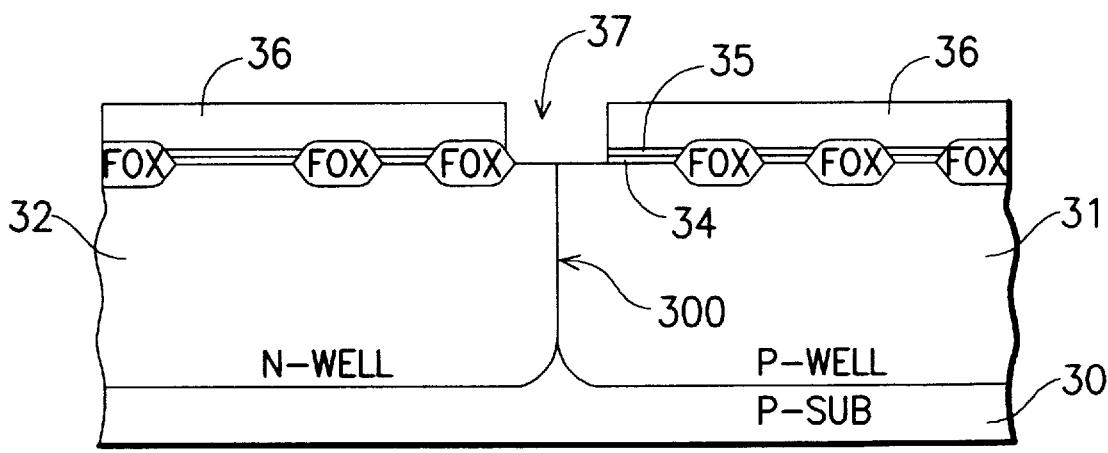

Then, thermal oxidation to the surface of those well regions 31 and 32 grows a thin oxide layer 34 overlying the portions not covered by the field oxides 33. A thin polysilicon layer 35 is thereafter deposited to overlie the thin oxide layer 34 for preventing contamination, as depicted in FIG. 2B. Referring to FIG. 2C, a photoresist layer 36 is coated on the overall surface and then patterned through photolithography to shape an opening 37 above the junction 300. Then, by using the photoresist layer 36 as masking, the thin polysilicon layer 35 and the thin oxide layer 34 are subsequently etched, through the opening 37, to expose the portions of well regions 31 and 32 in the vicinity of the junction 300, as depicted in FIG. 2C.

Figure 2D:
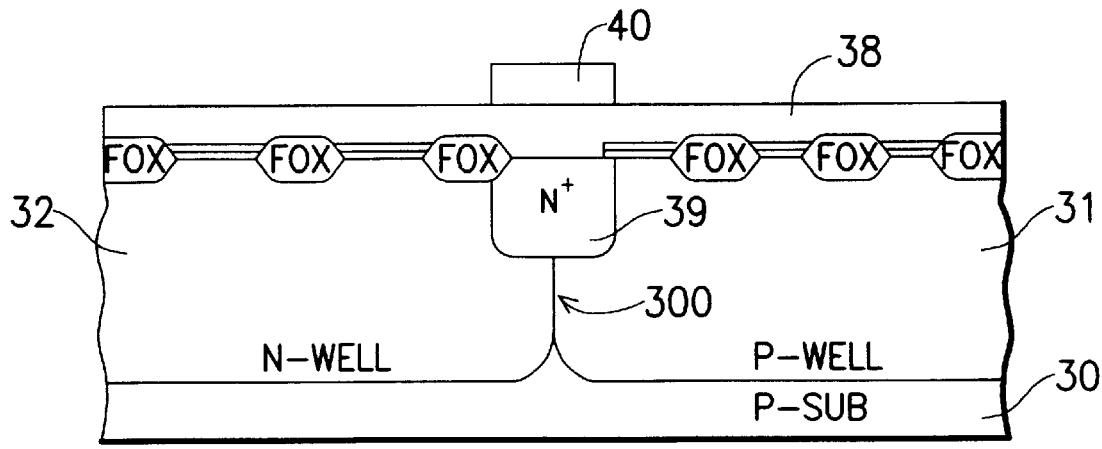

The photoresist layer 36 is thereafter removed. A polysilicon layer 38 is formed to overlie the overall surface as well as connected to the exposed well regions 31 and 32 above the junction 300 in a chemical vapor deposition (CVD) reactor. Note that the polysilicon layer 38 has been doped with n-type impurities, such as phosphorus-containing ions, therein. After that, a thermal annealing process is applied to deeply diffuse those n-type impurities contained in the polysilicon layer 38 to form an n-type doped region 39 between the well regions 31 and 32 above the junction 300, as depicted in FIG. 2D. Preferably, the n-type doped region 39 has a doping concentration of about $1\times10^{17}$–$1\times10^{19}$ cm$^{-3}$ and an junction depth of about 0.5–0.8 $\mu$m.

Figure 2E:
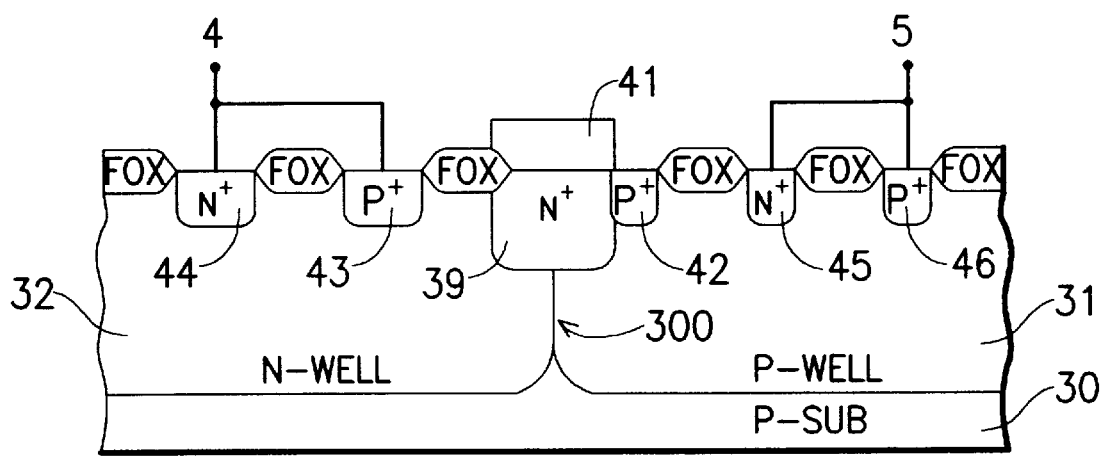

Moreover, another photoresist layer 40 is coated onto the polysilicon layer 38 and patterned by photolithography to shape a pattern above the n-type doped region 39. As depicted in FIG. 2E, by using the photoresist layer 40 as masking, the polysilicon layer 38 is patterned and etched to form a conducting block 41 covering the n-type doped region 38. Meanwhile, the thin polysilicon layer 35 and the thin oxide layer 34 are removed to expose the portions of the well regions 31 and 32 not covered by the field oxides 33. The photoresist layer 40 is thereafter removed. Then, a p-type doped region 42 is formed in the p-well region 31 by ion implantation, preferably, coming into contact with the n-type doped region 39 to form a pn-junction therebetween. Furthermore, the anode 4 of the SCR device is formed in the n-well region 32, and the cathode 5 of the SCR device is formed in the p-well region 31. As shown in FIG. 2E, the anode 4 is constituted by a p-type region 43 and an n-type region 44. The cathode 5 is constituted by an n-type region 45 and a p-type region 46.

Figure 1:
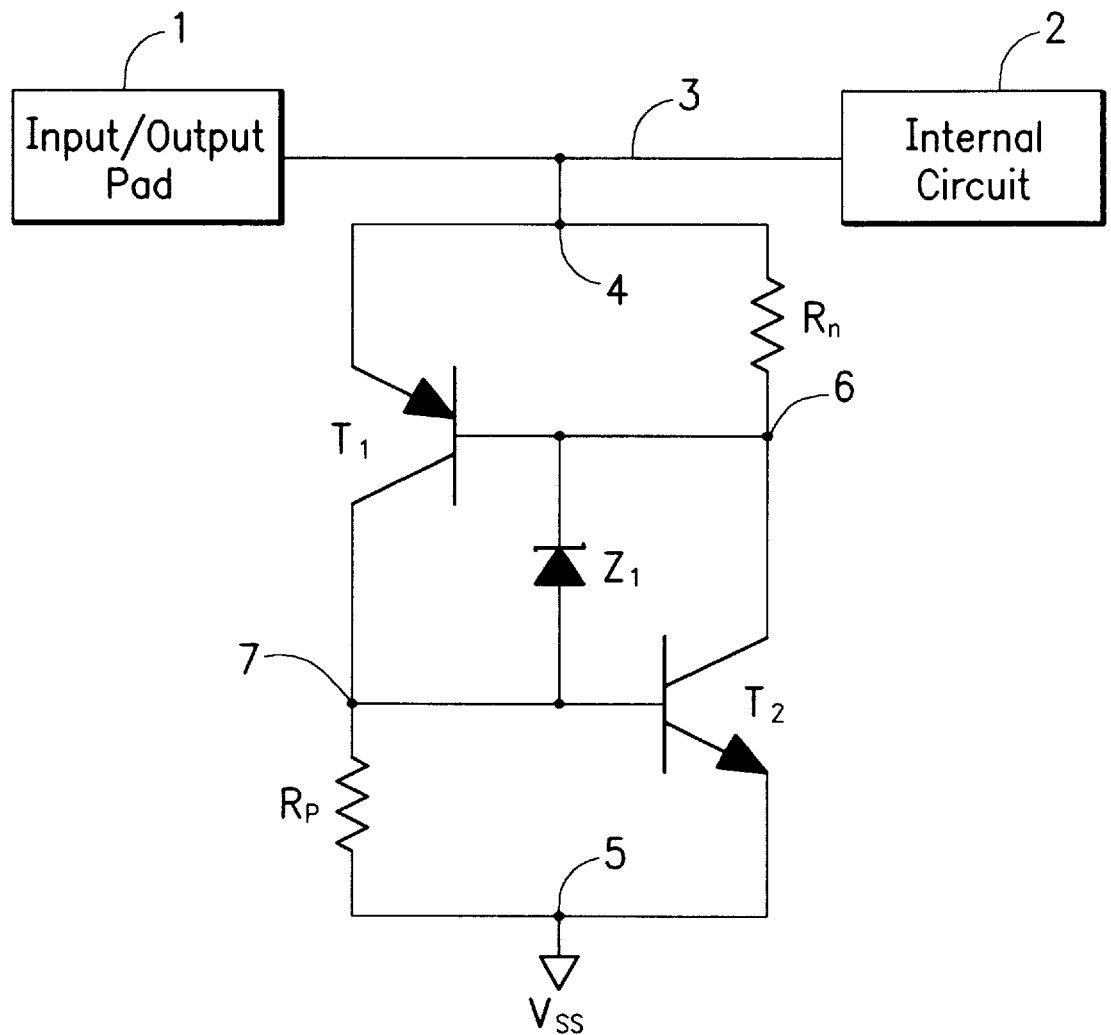
FIG. 1 is a schematic diagram of a low voltage zener-triggered SCR device.

As shown in FIG. 2E, the p-type region 43 located in the n-well region 32, the n-well region 32 itself, and the p-well region 31 serve as the emitter, base, and collector of the pnp bipolar transistor $T_1$, respectively The n-type region 45 located in the p-well region 31, the p-well region 31 itself, and the n-well region 32 act as the emitter, base, and collector of the npn bipolar transistor $T_2$, respectively. The n-type doped region 39 and the p-type doped region 42 build up the zener diode $Z_1$. Furthermore, the resistors $R_n$ and $R_p$ depicted in FIG. 1 represent the spreading resistance of the n-well region 32 and the p-well region 31, respectively. During the ESD event, zener breakdown occurs in the pn-junction between the n-type doped region 39 and the p-type doped region 42 to lower the trigger voltage of the lateral SCR device to within a range of about 5–7 Volts to discharge the ESD current before doing damage to the internal circuit 2.

Figure 3:
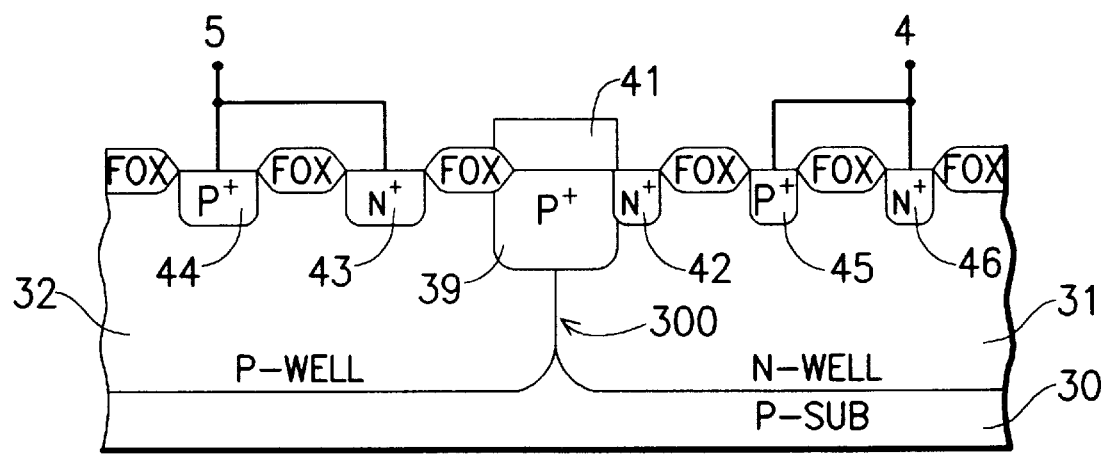
FIG. 3 schematically shows in cross section another preferred embodiment in accordance with the present invention.

Referring to FIG. 3, another preferred embodiment in accordance with the present invention is shown in a cross-sectional view. As compared with FIG. 2E, the conductivity types of n-type and p-type and the electric polarities of the anode 4 and cathode 5 are interchanged in FIG. 3.

As shown in FIG. 3, the p-type region 45 located in the n-well region 31, the n-well region 31 itself, and the p-well region 32 serve as the emitter, base, and collector of the pnp bipolar transistor $T_1$, respectively The n-type region 43 located in the p-well region 32, the p-well region 32 itself, and the n-well region 31 act as the emitter, base, and collector of the npn bipolar transistor $T_2$, respectively. The n-type doped region 42 and the p-type doped region 39 build up the zener diode $Z_1$. Furthermore, the resistors $R_n$ and $R_p$ depicted in FIG. 1 represent the spreading resistance of the n-well region 31 and the p-well region 32, respectively. During the ESD event, zener breakdown occurs in the formed pnjunction between the n-type doped region 42 and the p-type doped region 39 to lower the trigger voltage of the lateral SCR device to within the range of about 5–7 Volts to discharge the ESD current before doing damages to the internal circuit 2.

Figure 4:
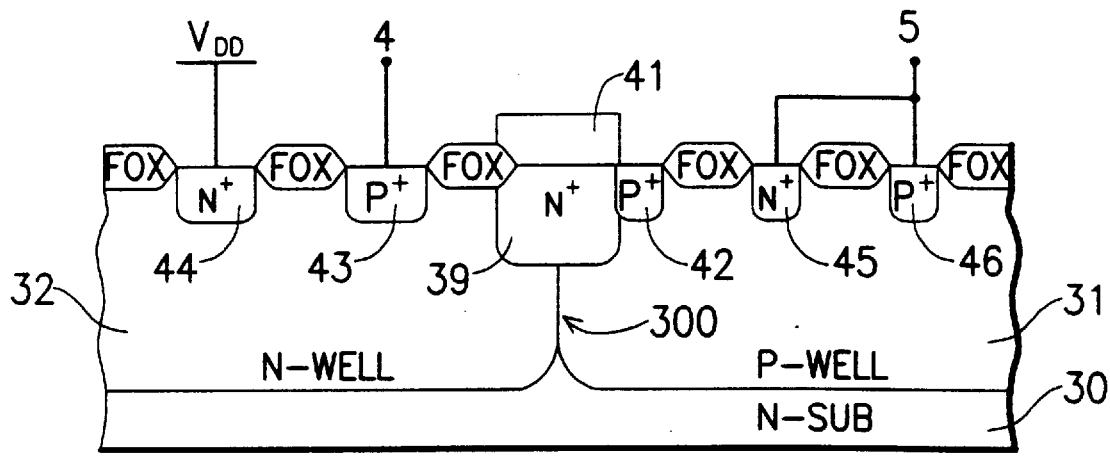
FIG. 4 schematically shows in cross section further another preferred embodiment in accordance with the present invention.
Figure 5:
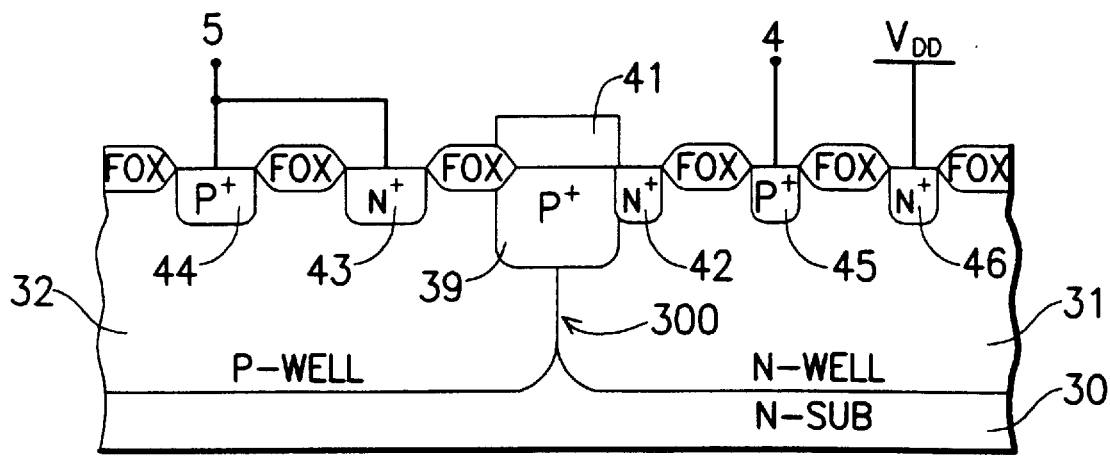
FIG. 5 schematically shows in cross section yet another preferred embodiment in accordance with the present invention.

Referring to FIG. 4, further another preferred embodiment in accordance with the present invention is shown in a cross section view. In comparison with FIG. 2E, the n-type region 44 formed in the n-well region 32 is connected to a power line $V_{DD}$ if an n-type silicon substrate 30 is provided. For the same reason, as depicted in FIG. 5, the n-type region 46 formed in the n-well region 31 is connected to the power line $V_{DD}$ instead of being tied to the anode as compared with FIG. 3. In addition, the conducting block 41 over the doped region 39 can be optionally removed.

In conclusion, the method, in accordance with the present invention, is compatible with conventional CMOS fabrication processes to form a zener diode and a lateral silicon controlled rectifier building up an ESD protection circuit in a semiconductor substrate. During an ESD event, the zener diode occurs breakdown to lower the trigger voltage of the lateral SCR device to within the range of about 5–7 Volts, and then discharges the ESD current before damaging an internal circuit to be protected.

What is claimed is:

1. A method of fabricating an ESD protection circuit, which is constituted by a silicon-controlled rectifier and a zener diode, comprising:
    (a) providing a semiconductor substrate;
    (b) forming a first well region of a first conductivity type in said substrate and a second well region of a second conductivity type is said substrate, said first and second well regions having a junction therebetween;
    (c) forming a polysilicon layer doped with impurities of the first conductivity type having at least a portion overlying said well regions over said junction;
    (d) forming a doped region striding between said well regions by deep diffusing said impurities from said polysilicon layer into said substrate;
    (e) patterning said polysilicon layer to form a conductive block covering said doped region of the first conductivity type;
    (f) forming a doped region of the second conductivity type in said second well region in a vicinity of said doped region of the first conductivity type to build up said zener diode; and
    (g) forming an anode of said silicon-controlled rectifier in one of said well regions as well as a cathode of said silicon-controlled rectifier in the other one of said well regions.

2. The method as claimed in claim 1, wherein, between steps (b) and (c), said method further comprises:
    forming a thin oxide layer overlying said well regions; and
    patterning and etching said thin oxide layer forming an opening to expose portions of said well regions above said junction.

3. The method as claimed in clam 1, wherein said doped region of the first conductivity type has a doping concentration in a range of $1\times10^{17}$ to $1\times10^{19}$cm$^{-3}$ and a junction depth in a range of about 0.5 to 0.8$\mu$m.

4. The method as claimed in claim 1, wherein said first conductivity type is n-type, and said second conductivity type is p-type.

5. The method as claimed in claim 4, wherein said anode consists of a p-type region formed in said first well region.

6. The method as claimed in claim 5, wherein said cathode consists of an n-type region formed in said second well region.

7. The method as claimed in claim 1, wherein said first conductivity type is p-type, and said second conductivity type is n-type.

8. The method as claimed in claim 7, wherein said cathode consists of an n-type region formed in said first well region.

9. The method as claimed in claim 8, wherein said anode consists of a p-type region formed in said second well region.

* * * * *